United States Patent
Nam et al.

(10) Patent No.: US 8,342,327 B1
(45) Date of Patent: Jan. 1, 2013

(54) CASSETTE FOR ACCOMMODATING SUBSTRATES

(75) Inventors: Eui-Woong Nam, Yongin (KR); Koang-Pyo Jin, Yongin (KR); Sang-Kyu Cho, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/295,492

(22) Filed: Nov. 14, 2011

(30) Foreign Application Priority Data

Jul. 7, 2011 (KR) .......................... 10-2011-0067537

(51) Int. Cl.
*A45C 13/10* (2006.01)
(52) U.S. Cl. .......................................... 206/454; 206/1.5
(58) Field of Classification Search .................. 206/454, 206/710, 711, 722, 724, 1.5, 455, 456, 449, 206/305
See application file for complete search history.

(56) References Cited

U.S. PATENT DOCUMENTS

| | | | |
|---|---|---|---|
| 6,491,177 B1 * | 12/2002 | Hyobu | 220/4.01 |
| 7,909,167 B2 * | 3/2011 | Chiu et al. | 206/710 |
| 2007/0175792 A1 * | 8/2007 | Gregerson | 206/711 |
| 2007/0297884 A1 | 12/2007 | Jung | |
| 2010/0282638 A1 * | 11/2010 | Chiu et al. | 206/710 |

FOREIGN PATENT DOCUMENTS

| | | |
|---|---|---|
| JP | 9-115997 | 5/1997 |
| JP | 11-159218 | 6/1999 |
| JP | 2001-102438 | 4/2001 |
| JP | 2003-89315 | 3/2003 |
| JP | 2007-142189 | 6/2007 |
| KR | 2001-0098420 | 11/2001 |
| KR | 10-2004-0066963 | 7/2004 |
| KR | 10-2005-0003763 | 1/2005 |
| KR | 10-2007-0021733 | 2/2007 |
| KR | 10-0772845 | 10/2007 |

* cited by examiner

*Primary Examiner* — Jacob K Ackun
(74) *Attorney, Agent, or Firm* — Robert E. Bushnell, Esq.

(57) ABSTRACT

A cassette for accommodating substrates may include a cassette body for accommodating the substrates; a door for selectively sealing the cassette body; magnetic units for primarily coupling the door to the cassette body; and latch units for secondarily coupling the door to the cassette body. Since the door completely contacts the cassette body, penetration of a contamination source from an external environment may be fundamentally prevented. Also, since the door is double coupled to the cassette body by the magnetic units and the latch units, firm coupling may be achieved.

26 Claims, 6 Drawing Sheets

CASSETTE FOR ACCOMMODATING SUBSTRATES

CLAIM OF PRIORITY

This application makes reference to, incorporates the same herein, and claims all benefits accruing under 35 U.S.C. §119 from an application earlier filed in the Korean Intellectual Property Office on Jul. 7, 2011 and there duly assigned Serial No. 10-2011-0067537.

BACKGROUND OF THE INVENTION

1. Field of the Invention

The present invention relates to a cassette, and more particularly, to a cassette for accommodating substrates to prevent contamination when the substrates are transferred or stored.

2. Description of the Related Art

Generally, flat display devices such as an organic light emitting display (OLED) or a liquid crystal display (LCD) use large-sized mother glass for convenience in the manufacturing process.

When a flat display device is manufactured, a cassette for accommodating substrates is used to transfer or store a plurality of sheets of mother glass. The cassette accommodates substrates such as a plurality of sheets of mother glass.

In most cases, a clean room for manufacturing flat display devices has air cleaning equipment. However, when substrates accommodated in a cassette are transferred and stored, foreign substances adhered to a worker or floating in the clean room may easily penetrate into the cassette, and may adhere to surfaces of the substrates. As such, the flat display devices may deteriorate. Accordingly, the inner space of the cassette needs to be selectively sealed.

SUMMARY OF THE INVENTION

According to an aspect of the present invention, there is provided a cassette for accommodating a plurality of substrates, and the cassette may include a cassette body for accommodating the substrates; a door for selectively sealing the cassette body; magnetic units for primarily coupling the door to the cassette body; and latch units for secondarily coupling the door to the cassette body.

The cassette body may form a framed structure in which a plurality of frames are connected in a box shape, and cover plates may be coupled onto the frames.

A plurality of supporting units for supporting the substrates which are vertically stacked may be formed in the cassette body, and may extend from a rear side of the cassette body toward an opening of the cassette body so as to cross an inner space of the cassette body, and seats for supporting side edges of the substrates may protrude from side frames of the cassette body.

Back stoppers for supporting rear edges of the substrates may be connected to the frames at the rear side of the cassette body.

A sealant may be further formed along edges of the door facing an opening of the cassette body.

The magnetic units may include one or more magnets formed in the door or the cassette body; and conductive plates formed in the cassette body or the door and coupled to the magnets due to a magnetic force.

The magnets may be formed along edges of the door facing an opening of the cassette body, and the conductive plates may be formed around the opening of the cassette body so as to correspond to the magnets.

Each of the latch units may include a latch pin inserted into a door guide groove formed in the door frames, and rectilinearly reciprocating toward and away from the cassette body.

The latch pin may include a body unit selectively coupled to a latch pin coupling recess formed in the cassette body; and a pin unit formed at one end of the body unit and having a latch pin hole into which a pin of an external tool is inserted so as to rectilinearly reciprocate the latch pin.

Each of the latch units may further include a position fixing unit for controlling motion of the latch pin.

The position fixing unit may include a locking recess formed around the body unit of the latch pin; and a locking unit formed in the door frames and selectively coupled to the locking recess so as to fix a position of the latch pin after the latch pin moves.

The locking unit may include a spring formed in a recess formed in the door frames; and a locking ball formed on the spring and selectively coupled to the locking recess.

The locking recess and the locking unit may be respectively formed in the body unit of the latch pin and the door frames at positions where the latch pin is prevented from being replaced after the latch pin is coupled to the latch pin coupling recess.

An open hole for inserting the pin of the external tool into the latch pin hole so as to rectilinearly move the latch pin may be further formed in a front surface of the door facing an opening of the cassette body.

One or more latch pin guides may be formed around the latch pin in the door guide groove of the door frames so as to prevent the latch pin from rattling when the latch pin moves.

One or more alignment holes, into which alignment pins of an external tool for selectively opening or closing the door with respect to the cassette body are inserted to align the external tool on the door, may be further formed in a front surface of the door.

Gas filtering units for controlling internal pressure of the sealed cassette body may be further formed in the door.

One or more corner guide units for allowing appropriate coupling of the door to the cassette body may be formed and spaced apart from each other along edges of the door facing an opening of the cassette body.

Regions vacuum-sucked by an external tool may be formed on a front surface of the door.

A sealant may be further formed along edges of an opening of the cassette body.

Overhead hoist transport (OHT) grips for transporting the cassette may be formed on an upper surface of the cassette body.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

While exemplary embodiments of the invention are susceptible to various modifications and alternative forms, specific embodiments thereof are shown by way of example in the drawings and will herein be described in detail. It should be understood, however, that there is no intent to limit exemplary embodiments of the invention to the particular forms disclosed, but conversely, exemplary embodiments of the invention are to cover all modifications, equivalents, and alternatives falling within the spirit and scope of the invention. In the following description of the present invention, a detailed description of known functions and configurations incorporated herein will be omitted when it may make the subject matter of the present invention unclear.

It will be understood that, although the terms first, second, etc. may be used herein to describe various elements, these elements should not be limited by these terms. These terms are only used to distinguish one element from another.

The terminology used herein is for the purpose of describing particular embodiments only and is not intended to be limiting of exemplary embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, components, and/or groups thereof, but do not preclude the presence or addition of one or more other features, integers, steps, operations, elements, components, and/or groups thereof.

Hereinafter, the present invention will be described in detail by explaining embodiments of the invention with reference to the attached drawings. Like reference numerals in the drawings denote like elements, and thus repeated descriptions will be omitted.

Figure 1:
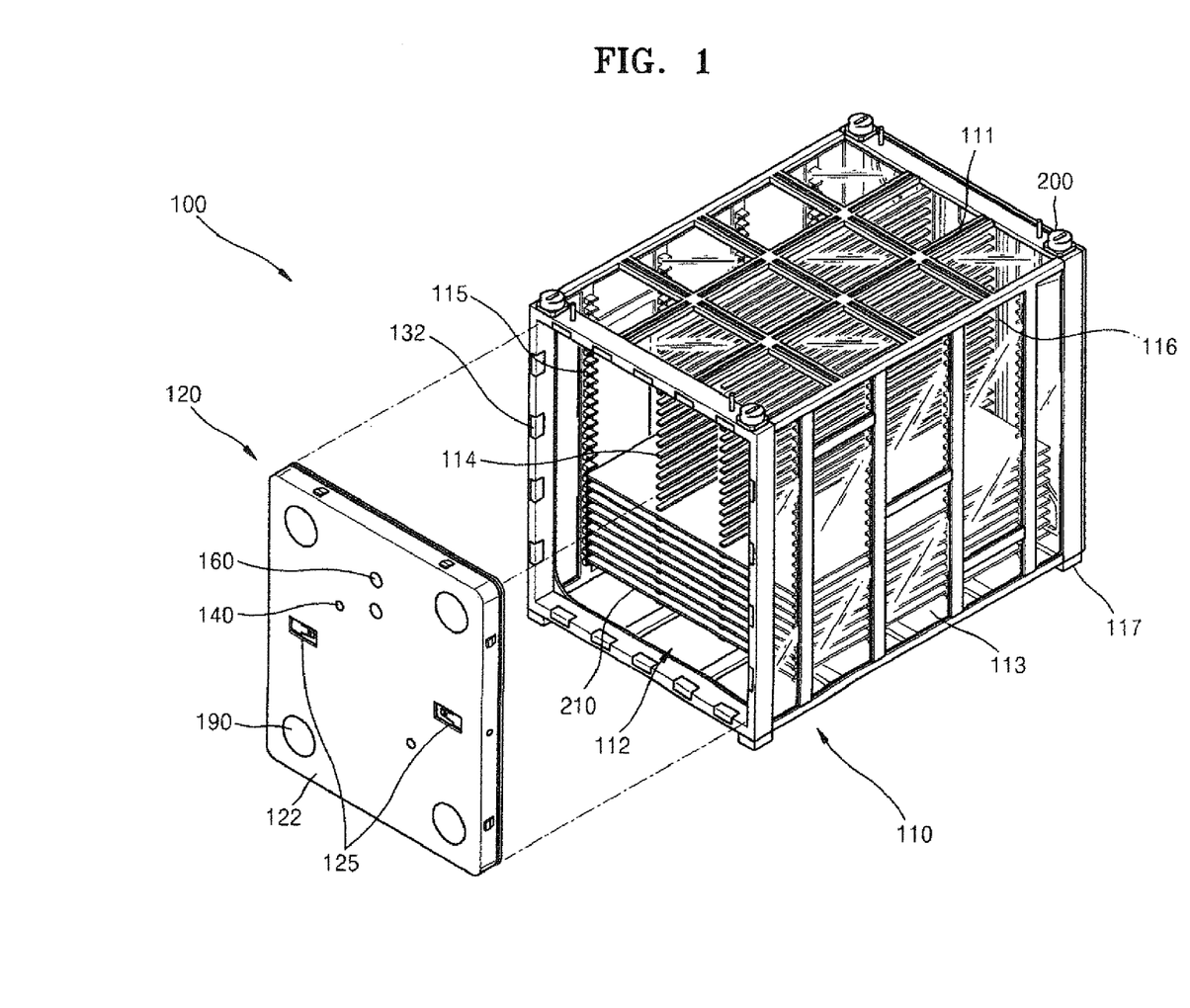
FIG. 1 is an exploded front perspective view of a cassette for accommodating substrates according to an embodiment of the present invention.
Figure 2:
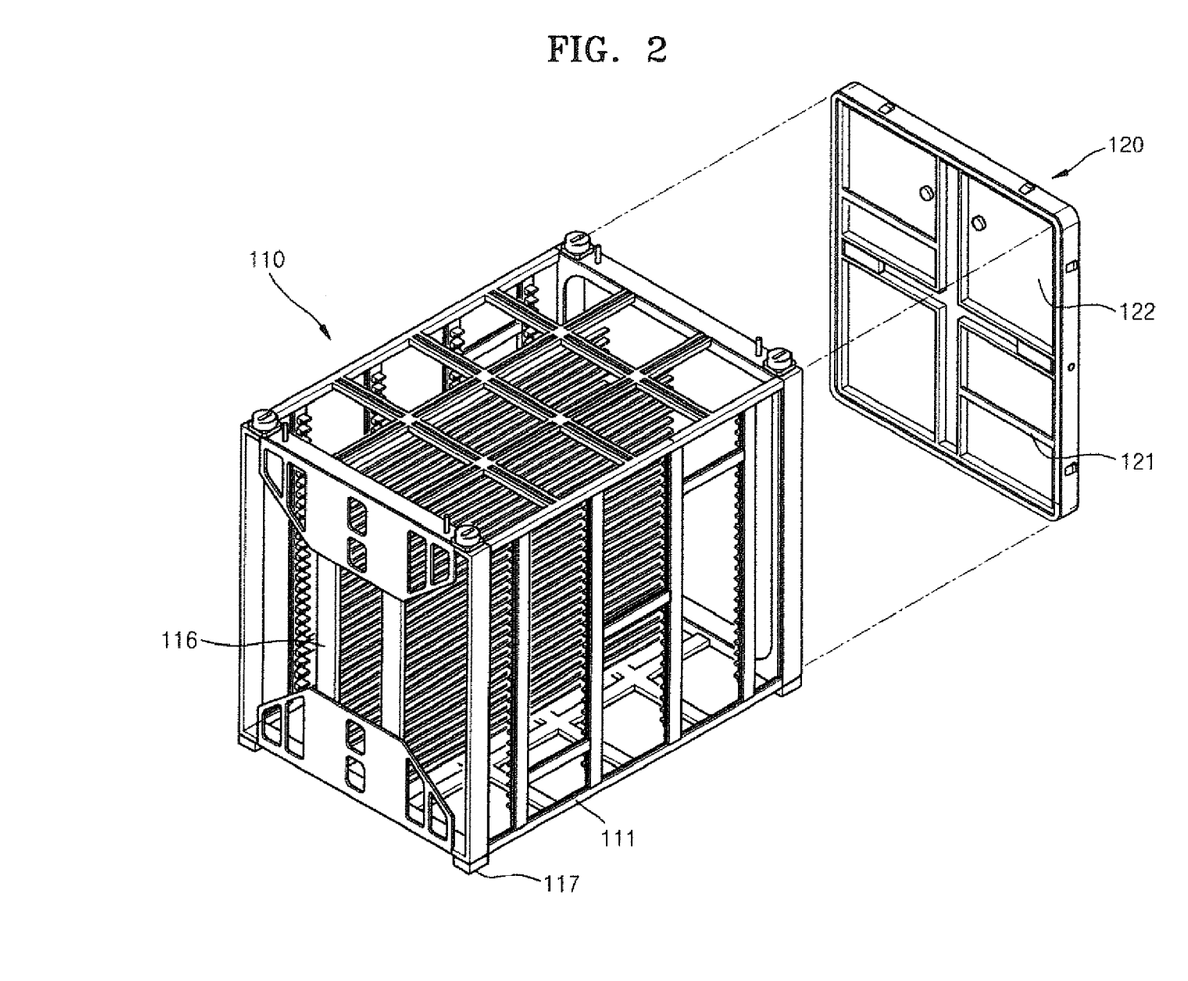
FIG. 2 is an exploded rear perspective view of the cassette illustrated in FIG. 1.

FIG. 1 is an exploded front perspective view of a cassette for accommodating substrates according to an embodiment of the present invention; FIG. 2 is an exploded rear perspective view of the cassette illustrated in FIG. 1; and FIG. 3 is a perspective view of a door illustrated in FIG. 1.

Figure 3:
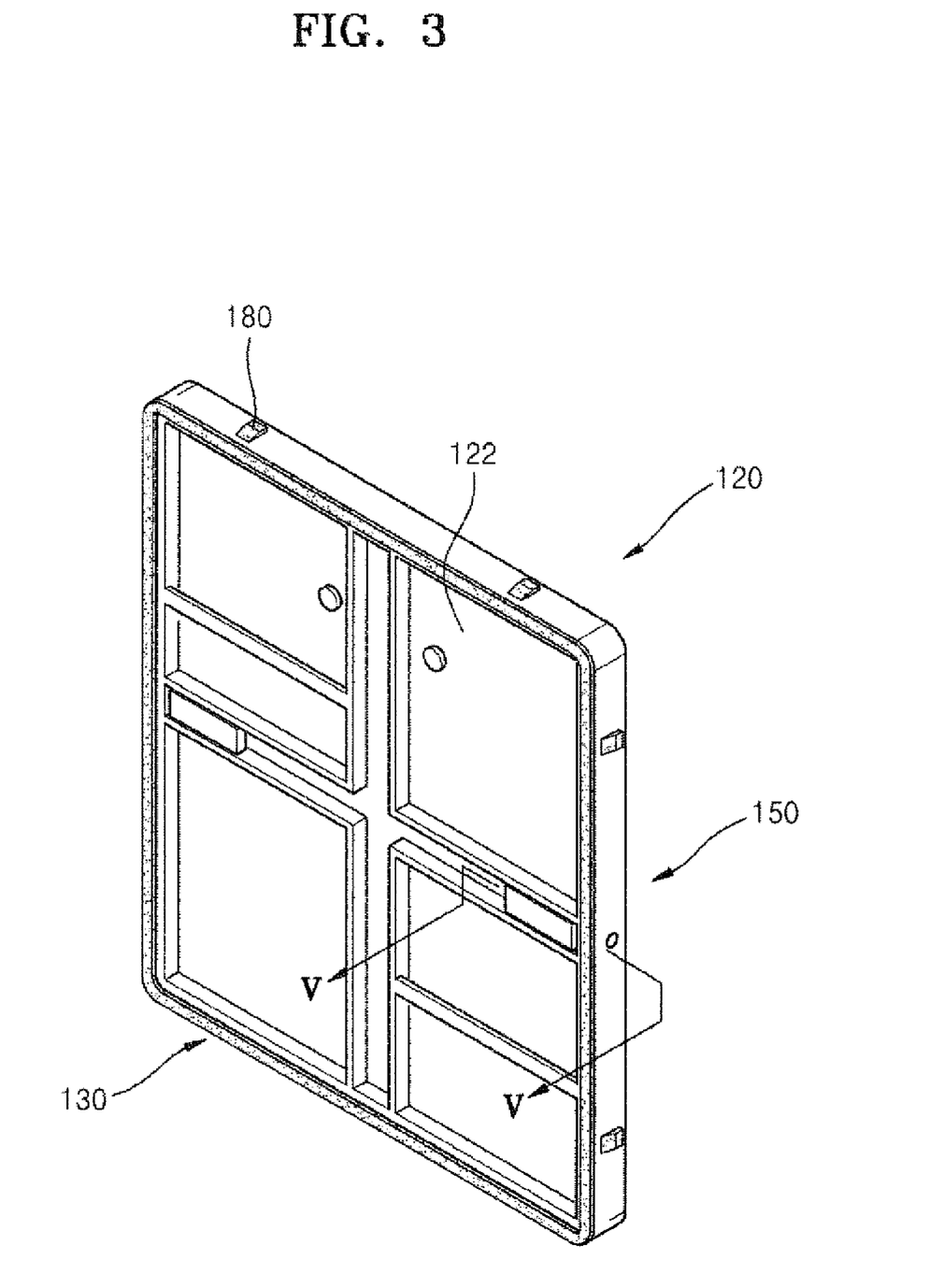
FIG. 3 is a perspective view of a door illustrated in FIG. 1.

Referring to FIGS. 1 through 3, the cassette 100 includes a cassette body 110, a door 120, magnetic units 130, and latch units 150.

The cassette body 110 forms a framed structure in which a plurality of frames 111 are connected in a box shape. In this case, at least one surface of the cassette body 110 is formed as an opening 112 for providing an entrance for accommodating the substrates 210 such as a plurality of sheets of mother glass. The frames 111 may be formed of a metallic material having an excellent rigidity.

Cover plates 113 are coupled to the outside of the frames 111. One cover plate 113 may be formed in each surface of the framed structure, or a plurality of cover plates 113 may be formed to cover regions where the frames 111 are connected to each other.

As a coupling method, the cover plates 113 may be inserted into grooves formed in the frames 111, or may be screwed onto front or rear surfaces of the frames 111. However, the coupling method is not limited thereto. The cover plates 113 entirely cover the outside of the frames 111 except for the opening 112. The cover plates 113 may be formed of polymer resin such as polycarbonate.

A plurality of supporting units 114 for supporting the substrates 210, which are vertically stacked, are formed in the cassette body 110. The supporting units 114 are formed to prevent the substrates 210 having a large size, from sagging downward.

The supporting units 114 are formed from a rear side of the cassette body 110 toward a front side of the cassette body 110, i.e., toward the opening 112, so as to cross an inner space of the cassette body 110 in a horizontal direction. The supporting units 114 are coupled to the frames 111 of the cassette body 110 by additionally formed supporting members (not shown). The supporting units 114 are formed as strips for supporting lower surfaces of the substrates 210. The supporting units 114 are spaced apart from each other in a vertical direction of the cassette body 110.

Seats 115 are formed at two facing sides of the cassette body 110. The seats 115 are formed as protrusions protruding from left and right frames 111 toward the inner space of the cassette body 110. The seats 115 are formed to support left and right edges of the substrates 210. The seats 115 are disposed at the same heights as the supporting units 114.

As such, when the substrates 210 are loaded into the cassette body 110, the lower surfaces of the substrates 210 are supported by the supporting units 114. Simultaneously, side edges of the substrates 210 are supported by the seats 115. Accordingly, the substrates 210 are safely disposed in the cassette body 110.

Back stoppers 116 are formed at the rear side of the cassette body 110. The back stoppers 116 are formed as one or more vertical strips. The back stoppers 116 are connected to rear frames 111 of the cassette body 110. The back stoppers 116 support rear edges of the substrates 210.

The back stoppers 116 prevent the substrates 210, which are accommodated through the opening 112 of the cassette body 110, from moving beyond the rear side of the cassette body 110.

Meanwhile, pads 117 having a buffering force for absorbing external impacts when the cassette body 110 moves are formed under the frames 111.

The door 120 is formed at the front side of the cassette body 110. The door 120 is selectively coupled to the opening 112 for providing an entrance for accommodating the substrates 210. As such, the cassette body 110 may be open or closed by the door 120.

A plurality of door frames 121 are connected to each other to form the door 120, and a door plate 122 is coupled onto the door frames 121. The door 120 has a size sufficient to completely cover the opening 112.

Here, the magnetic units 130 are formed on the cassette body 110 and the door 120 so as to selectively couple the door 120 to the cassette body 110.

The magnetic units 130 include one or more magnets 131 (see FIG. 4) formed in the cassette body 110 or the door 120, and conductive plates 132 formed in the door 120 or the cassette body 110 so as to correspond to the magnets 131.

The magnetic units 130 will now be described in detail.

Figure 4:
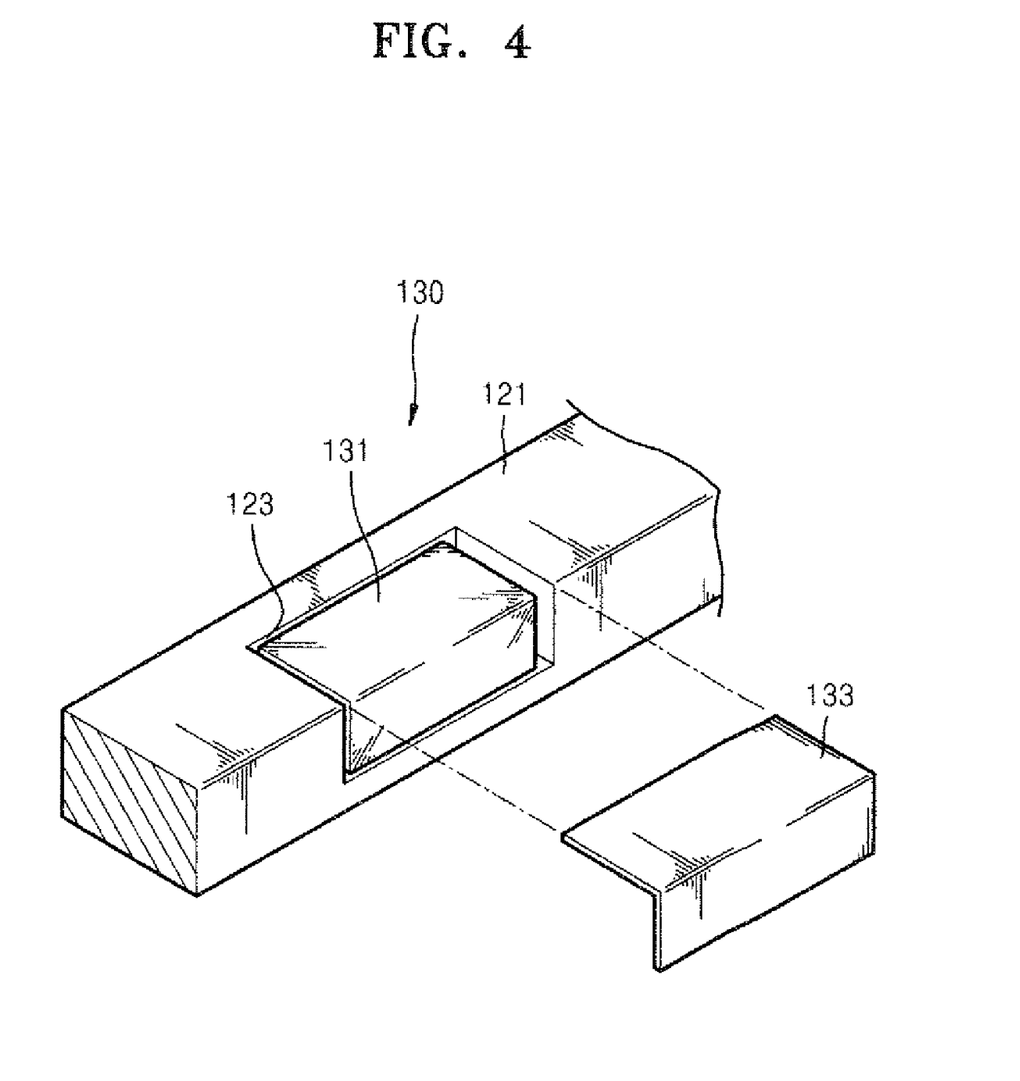
FIG. 4 is a magnified perspective view of a magnetic unit illustrated in FIG. 3.

FIG. 4 is a magnified perspective view of a magnetic unit illustrated in FIG. 3. More specifically, FIG. 4 illustrates a portion of the door 120 in which the magnetic units 130 illustrated in FIG. 3 are formed.

Referring to FIGS. 3 and 4, magnetic unit recesses 123 are formed and spaced apart from each other in the door frames 121 along edges of the door 120 facing the opening 112 of the cassette body 110 illustrated in FIG. 1. The magnetic unit recesses 123 accommodate the magnets 131, such as neodymium (Nd) magnets having a strong magnetic force. Magnet retainers 133 may be formed to cover the magnets 131.

The conductive plates 132 (see FIG. 1) coupled to the magnets 131 when the door 120 is coupled to the cassette body 110 are formed around the opening 112 of the cassette body 110 facing the magnets 131. The conductive plates 132 are disposed so as to correspond to the magnets 131 along edges of the opening 112 of the cassette body 110. The conductive plates 132 may be formed by forming grooves in the door frames 121.

If the door 120 contacts the cassette body 110, the magnets 131 formed in a front surface of the door 120 are adhered to the conductive plates 132 formed in the cassette body 110. Accordingly, the inner space of the cassette 100 may be sealed from the external environment.

In this case, the latch units 150 are further formed in the cassette body 110 and the door 120 so as to enhance the coupling of the door 120 to the cassette body 110.

Figure 5:
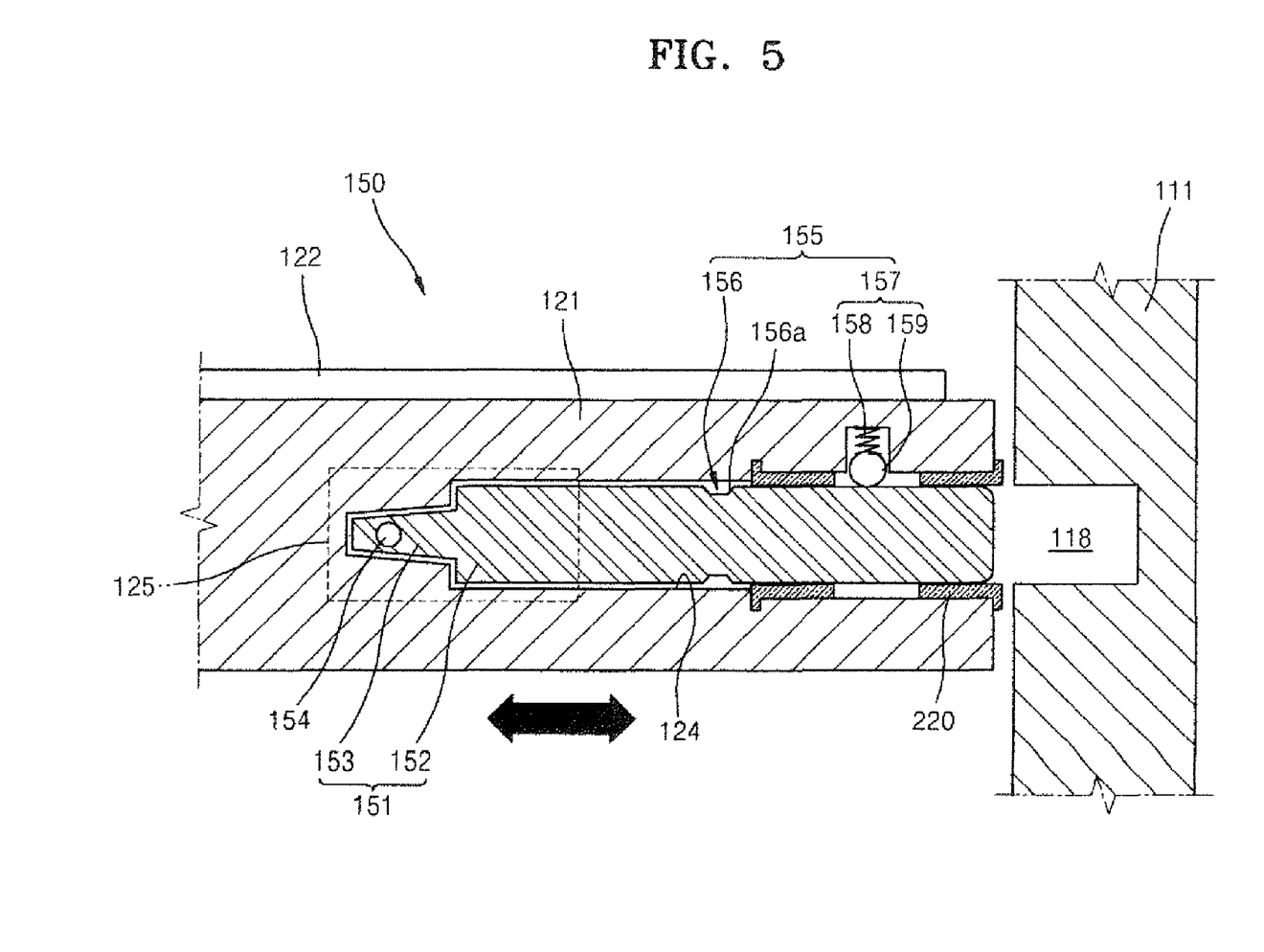
FIG. 5 is a cross-sectional view cut along a line V-V illustrated in FIG. 3.

FIG. 5 is a cross-sectional view cut along a line V-V illustrated in FIG. 3.

Referring to FIG. 5, the latch unit 150 includes a latch pin 151 formed in the door frame 121. The latch pin 151 includes a body unit 152 having a cylindrical shape, and a pin unit 153 protruding from one end of the body unit 152.

The latch pin 151 is inserted into a door guide groove 124 formed in the door frame 121 so as to rectilinearly reciprocate toward and away from the frame 111 of the cassette body 110. The door guide groove 124 extends to a predetermined length in a horizontal direction of the door frame 121.

A latch pin hole 154 is formed in the pin unit 153. A pin (not shown) of an external tool for sucking the door 120 (e.g., a robot tool) is inserted into the latch pin hole 154.

After the pin of the robot tool is inserted into the latch pin hole 154, the latch pin 151 may be rectilinearly reciprocated by the robot tool, and thus may be inserted into a latch pin coupling recess 118 formed in the frame 111 of the cassette body 110.

In this case, a position fixing unit 155 for controlling motion of the latch pin 151 is further formed around the latch pin 151. The position fixing unit 155 includes a locking recess 156 formed in the latch pin 151, and a locking unit 157 formed in the door frame 121.

The locking recess 156 is formed to a predetermined depth around the body unit 152 of the latch pin 151. The locking unit 157 is selectively coupled to the locking recess 156 so as to fix the position of the latch pin 151 after the latch pin 151 moves.

The locking unit 157 includes a spring 158 formed in a recess in the door frame 121, and a locking ball 159 formed on the spring 158 and coupled to the locking recess 156. The locking ball 159 maintains an elastic force due to the spring 158.

After the latch pin 151 is inserted into the latch pin coupling recess 118 in order to prevent the latch pin 151 from being displaced due to an external impact or the like, the locking ball 159 is coupled to the locking recess 156.

The locking recess 156 and the locking unit 157 are respectively formed in the body unit 152 of the latch pin 151 and in the door frame 121 at positions where the latch pin 151 may be prevented from being replaced after the latch pin 151 is coupled to the latch pin coupling recess 118.

An entrance 156a of the locking recess 156 may be curved to allow appropriate coupling of the locking ball 159, and to prevent wear of the locking ball 159.

Also, one or more latch pin guides 220 are formed in the door guide groove 124 so as to prevent the latch pin 151 from rattling due to a gap between the latch pin 151 and the door guide groove 124 when the latch pin 151 rectilinearly reciprocates.

The latch pin guides 220 surround the latch pin 151. The latch pin guides 220 are formed along a circumference of, or on an inner circumferential wall of, the door guide groove 124 formed in the door frame 121. The latch pin guides 220 may be formed of polymer resin capable of reducing wear of the latch pin 151 when the latch pin 151 moves.

Meanwhile, an open hole 125 for inserting the pin of the robot tool into the latch pin hole 154 so as to move the latch pin 151 leftward or rightward, and for providing a space where the pin of the robot tool moves, is further formed in the front surface of the door 120.

Referring back to FIGS. 1 through 3, a plurality of alignment holes 140 are formed in the front surface of the door 120. When the door 120 is selectively coupled to the cassette body 110, the robot tool for sucking the door 120 contacts the front surface of the door 120. In this case, the alignment holes 140 into which alignment pins of the robot tool are inserted are formed in the door 120 so as to check whether the robot tool is disposed at a right position on the door 120.

The alignment holes 140 are formed to a predetermined depth along a thickness direction of the door plate 122 in the front surface of the door 120. The alignment holes 140 may have a size for inserting the alignment pins of the robot tool in the thickness direction of the door plate 122, and may not penetrate through the door plate 122. The alignment holes 140 are formed along a diagonal direction in the front surface of the door 120.

Meanwhile, in order to control internal pressure, to enhance sealability, to utilize attachment and detachment, or to perform vacuum suction, an additional element is formed in the door 120.

A plurality of gas filtering units 160 are formed in the door 120. The gas filtering units 160 discharge internal air if internal pressure of the cassette 100 is increased, or filter a foreign substance entering the cassette 100.

Figure 6:
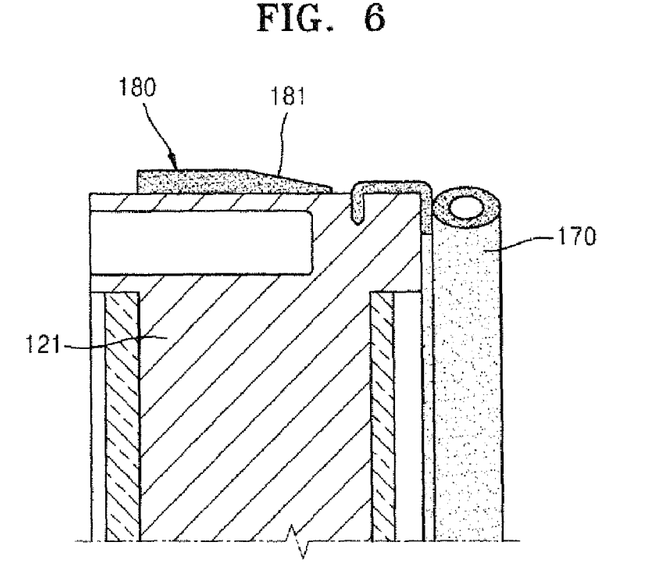
FIG. 6 is a magnified perspective view of a corner guide unit and a sealant illustrated in FIG. 3.
Figure 7:
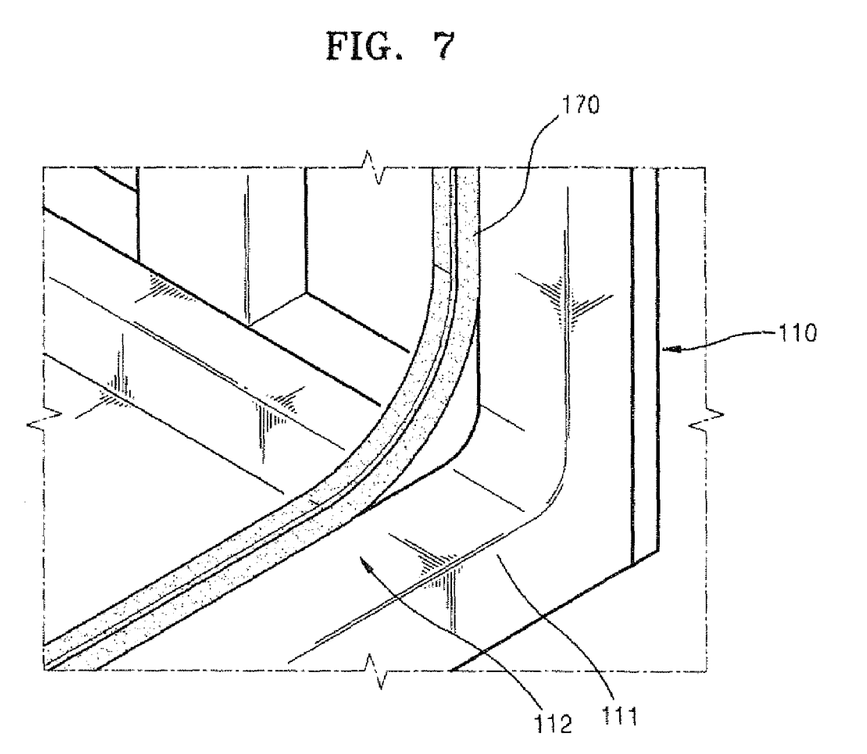
FIG. 7 is a magnified perspective view of a cassette body and a sealant, according to another embodiment of the present invention.

FIG. 6 is a magnified perspective view of a corner guide unit and a sealant illustrated in FIG. 3; and FIG. 7 is a magnified perspective view of a cassette body and a sealant, according to another embodiment of the present invention.

As illustrated in FIG. 6, a sealant 170 is formed on a rear surface of the door 120 facing the opening 112 of the cassette body 110 and along edges of the door 120. Alternatively, as illustrated in FIG. 7, the sealant 170 may be formed inside the frames 111 along edges of the opening 112 of the cassette body 110.

Referring back to FIG. 6, a plurality of corner guide units 180 are formed on the rear surface of the door 120 facing the opening 112 of the cassette body 110. The corner guide units 180 are spaced apart from each other along the edges of the door 120. Portions 181 of the corner guide units 180 adjacent to the opening 112 of the cassette body 110 are tapered so as to allow appropriate coupling of the door 120 to the cassette body 110. The corner guide units 180 may be formed of polymer resin.

Also, vacuum suction regions 190 (see FIG. 1), where vacuum suction units of the robot tool perform vacuum suction, are formed on the front surface of the door 120 opposite the opening 112 of the cassette body 110. The vacuum suction regions 190 are formed at four corners of the door 120. The vacuum suction units of the robot tool may individually perform vacuum suction on the vacuum suction regions 190 so as to selectively separate the door 120 from the cassette body 110.

Meanwhile, referring back to FIGS. 1 through 3, overhead hoist transport (OHT) grips 200 for transporting the cassette 100 are formed on an upper surface of the cassette body 110.

Operation of the cassette 100 having the above-described structure will now be described.

Here, in the cassette 100, the substrates 210 are stacked in an inner space of the cassette body 110, and the door 120 is coupled to the cassette body 110.

Initially, a robot tool approaches to contact the door 120. After the robot tool contacts the door 120, a plurality of alignment pins of the robot tool are inserted into the alignment holes 140 formed along a diagonal direction in a front surface of the door 120. By inserting the alignment pins of the robot tool into the alignment holes 140, it may be checked whether the robot tool is disposed at a right position on the door 120.

Then, a plurality of vacuum suction units of the robot tool perform vacuum suction on the vacuum suction regions 190 formed at corners of the front surface of the door 120. The door 120 may be sucked by the vacuum suction units of the robot tool until one cycle process is completed, thereby reducing the number of processes.

After that, the latch units 150 formed as safety elements to enhance a coupling force of the door 120 to the cassette body 110 are operated to release the coupling state of the door 120 to the cassette body 110.

In more detail, the latch pin 151 is coupled to the latch pin coupling recess 118 formed in the frame 111 of the cassette body 110. In order to release the coupling, a pin of the robot tool is inserted into the latch pin hole 154 through the open hole 125 formed in the front surface of the door 120.

Then, the pin unit 153 in which the latch pin hole 154 is formed is moved to a left side of the door 120 such that the body unit 152 of the latch pin 151 coupled to the latch pin coupling recess 118 is separated from the latch pin coupling recess 118.

In this case, since the locking ball 159 coupled to the locking recess 156 to control motion of the latch pin 151 mechanically contacts the locking recess 156, the locking ball 159 is separated from the locking recess 156. As such, the latch pin 151 may move leftward along the door guide groove 124.

By operating the latch units 150 as described above, the latch pin 151 is released from the latch pin coupling recess 118 formed in the frame 111 of the cassette body 110.

Then, the door 120 sucked by the vacuum suction units of the robot tool is separated from the cassette body 110. In this case, the magnets 131 of the door 120 adhered to the conductive plates 132 of the cassette body 110 are forcibly released due to an external force of the robot tool.

After that, the substrates 210 vertically stacked in the cassette body 110 are unloaded by using an unloading tool, and are then transferred to perform a desired process.

After the substrates 210 vertically stacked in the cassette body 110 are completely unloaded, a plurality of other substrates 210 are loaded into the cassette body 110.

In this case, since the substrates 210 have a large size, central portions may sag downward. In order to prevent this problem, the substrates 210 are supported by the supporting units 114 formed from a rear side of the cassette body 110 toward the opening 112 so as to cross the inner space of the cassette body 110. Simultaneously, left and right edges of the substrates 210 are seated on the seats 115 formed to face each other and protruding from the frames 111.

Also, the substrates 210 are supported by the back stoppers 116 formed at the rear side of the cassette body 110, and thus do not move beyond the rear side of the cassette body 110. As such, the substrates 210 may be safely accommodated in the cassette body 110.

After a plurality of substrates 210 are completely reloaded as described above, the door 120 is coupled to the cassette body 110. In this case, the door 120 is already vacuum-sucked by the vacuum suction units of the robot tool in the previous process.

The magnets 131, formed in the magnetic unit recesses 123 along edges of the door 120, are adhered to the conductive plates 132 formed around the opening 112 of the cassette body 110 so as to correspond to the magnets 131. Accordingly, the door 120 is primarily coupled to the cassette body 110.

In this case, the corner guide units 180 are formed on the rear surface of the door 120 facing the opening 112 of the cassette body 110. Since the portions 181 of the corner guide units 180 adjacent to the opening 112 of the cassette body 110 are tapered, the door 120 is appropriately coupled to the cassette body 110.

Furthermore, since the sealant 170 is formed on the rear surface of the door 120 facing the opening 112 of the cassette body 110 and along edges of the door 120, sealability is enhanced.

Then, the latch units 150 formed to enhance a coupling force of the door 120 to the cassette body 110 are operated to firmly couple the door 120 to the cassette body 110.

After the door 120 is coupled to the cassette body 110, the pin of the robot tool is inserted into the latch pin hole 154. Then, the pin unit 153 in which the latch pin hole 154 is formed is moved to a right side of the door 120 so that the body unit 152 of the latch pin 151 is inserted into the latch pin coupling recess 118 formed in the frame 111 of the cassette body 110.

In this case, the locking ball 159 formed in the door frame 121 is elastically coupled to the locking recess 156 formed around the latch pin 151 so as to prevent motion of the latch pin 151. In this case, the entrance 156a of the locking recess 156 is curved to allow appropriate coupling of the locking ball 159.

Then, the vacuum suction units of the robot tool are separated from the vacuum suction regions 190 of the door 120.

After that, the alignment pins of the robot tool inserted into the alignment holes 140 formed along a diagonal direction in the front surface of the door 120 are separated.

Accordingly, one cycle process of the cassette 100 is completed.

As such, the cassette 100 may greatly improve the coupling force of the door 120 to the cassette body 110 primarily by the magnetic units 130 and secondarily by the latch units 150.

As described above, in a cassette for accommodating substrates, according to the present invention, since the door completely contacts the cassette body, penetration of a contamination source from an external environment may be fundamentally prevented. Also, since the door is double coupled to the cassette body by magnetic units and latch units, firm coupling may be achieved.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A cassette for accommodating a plurality of substrates, the cassette comprising:
   a cassette body for accommodating the substrates;
   a door for selectively sealing the cassette body, and a front surface of the door comprising at least one alignment hole into which at least one alignment pin of an external tool for selectively opening and closing the door with respect to the cassette body is inserted to align the external tool on the door;
   magnetic units for primarily coupling the door to the cassette body; and
   latch units for secondarily coupling the door to the cassette body.

2. The cassette of claim 1, wherein the cassette body forms a framed structure in which a plurality of frames are connected in a box shape, and wherein cover plates are coupled onto the frames.

3. The cassette of claim 2, further comprising a plurality of supporting units formed in the cassette body for supporting the substrates which are vertically stacked, wherein the plurality of supporting units extend from a rear side of the cassette body toward an opening of the cassette body so as to cross an inner space of the cassette body;
   said cassette further comprising seats for supporting side edges of the substrates protrude from side frames of the cassette body.

4. The cassette of claim 3, further comprising back stoppers connected to the frames at the rear side of the cassette body for supporting rear edges of the substrates.

5. The cassette of claim 1, wherein a sealant is formed along edges of the door facing an opening of the cassette body.

6. The cassette of claim 1, wherein the magnetic units comprise:
   at least one magnet formed in the door or the cassette body; and
   conductive plates formed in one of the cassette body and the door, and coupled to said at least one magnet due to a magnetic force.

7. The cassette of claim 6, wherein said at least one magnet is formed along edges of the door facing an opening of the cassette body; and
   wherein the conductive plates are formed around an opening of the cassette body so as to correspond to said at least one magnet.

8. The cassette of claim 7, further comprising magnet retainers formed outside said at least one magnet to surround at least portions of said at least one magnet.

9. The cassette of claim 1, wherein each of the latch units comprises a latch pin inserted into a door guide groove formed in door frames, and rectilinearly reciprocating toward and away from the cassette body.

10. The cassette of claim 9, wherein the latch pin comprises:
    a body unit selectively coupled to a latch pin coupling recess formed in the cassette body; and
    a pin unit formed at one end of the body unit and having a latch pin hole into which a pin of an external tool is inserted to rectilinearly reciprocate the latch pin.

11. The cassette of claim 10, wherein each of the latch units further comprises a position fixing unit for controlling motion of the latch pin.

12. The cassette of claim 11, wherein the position fixing unit comprises:
    a locking recess formed around the body unit of the latch pin; and
    a locking unit formed in the door frames and selectively coupled to the locking recess so as to fix a position of the latch pin after the latch pin moves.

13. The cassette of claim 12, wherein the locking unit comprises:
    a spring formed in a recess formed in the door frames; and
    a locking ball formed on the spring and selectively coupled to the locking recess.

14. The cassette of claim 12, wherein the locking recess and the locking unit are respectively formed in the body unit of the latch pin and in the door frames at positions where the latch pin is prevented from being replaced after the latch pin is coupled to the latch pin coupling recess.

15. The cassette of claim 12, wherein an entrance of the locking recess is curved.

16. The cassette of claim 10, wherein an open hole for inserting the pin of the external tool into the latch pin hole so as to rectilinearly move the latch pin is formed in a front surface of the door facing an opening of the cassette body.

17. The cassette of claim 10, further comprising at least one latch pin guide formed around the latch pin in the door guide groove of the door frames for preventing the latch pin from rattling when the latch pin moves.

18. The cassette of claim 17, wherein said at least one latch pin guide is formed of polymer resin.

19. The cassette of claim 1, wherein said at least one alignment hole has a size sufficient to insert said at least one alignment pin of the external tool in a thickness direction of the door.

20. The cassette of claim 1, wherein said at least one alignment hole is formed along a diagonal direction in the front surface of the door.

21. The cassette of claim 1, further comprising gas filtering units formed in the door for controlling internal pressure of the sealed cassette body.

22. The cassette of claim 1, further comprising at least one corner guide unit formed and spaced apart from each other along edges of the door facing an opening of the cassette body for allowing appropriate coupling of the door to the cassette body.

23. The cassette of claim 22, wherein portions of said at least one corner guide unit adjacent to the opening of the cassette body is tapered.

24. The cassette of claim 1, wherein regions vacuum-sucked by an external tool are formed on a front surface of the door.

25. The cassette of claim 1, wherein a sealant is formed along edges of an opening of the cassette body.

26. The cassette of claim 1, further comprising overhead hoist transport (OHT) grips formed on an upper surface of the cassette body for transporting the cassette.

* * * * *